United States Patent
Hung

(10) Patent No.: US 8,358,146 B2
(45) Date of Patent: Jan. 22, 2013

(54) CMOS IMAGE SENSOR TEST PROBE CARD

(75) Inventor: Chien-Yao Hung, Hsin-Chu (TW)

(73) Assignee: Hermes Testing Solutions Inc., Hsinchu (TW)

(*) Notice: Subject to any disclaimer, the term of this patent is extended or adjusted under 35 U.S.C. 154(b) by 275 days.

(21) Appl. No.: 12/579,326

(22) Filed: Oct. 14, 2009

(65) Prior Publication Data
US 2010/0127722 A1    May 27, 2010

Related U.S. Application Data

(60) Provisional application No. 61/117,568, filed on Nov. 24, 2008.

(51) Int. Cl.
*G01R 31/20* (2006.01)
(52) U.S. Cl. ......... 324/754.03; 324/756.03; 324/754.23; 250/492.1
(58) Field of Classification Search .................. None
See application file for complete search history.

(56) References Cited

U.S. PATENT DOCUMENTS

| | | | |
|---|---|---|---|
| 6,515,494 B1* | 2/2003 | Low | 324/750.23 |
| 7,002,363 B2* | 2/2006 | Mathieu | 324/750.03 |
| 7,341,881 B2* | 3/2008 | Watkins et al. | 438/26 |
| 7,642,792 B2* | 1/2010 | Jager | 324/756.03 |
| 7,868,630 B2* | 1/2011 | Caldwell et al. | 324/754.23 |
| 2006/0214673 A1* | 9/2006 | Tamai | 324/753 |
| 2008/0149853 A1* | 6/2008 | Hebert et al. | 250/492.1 |
| 2008/0218186 A1* | 9/2008 | Kooiman et al. | 324/754 |
| 2010/0013505 A1* | 1/2010 | Takekoshi | 324/754 |

FOREIGN PATENT DOCUMENTS

JP    2008-122140    *    5/2008    .......... 31/26

* cited by examiner

*Primary Examiner* — Richard Isla Rodas
(74) *Attorney, Agent, or Firm* — Stout, Uxa, Buyan & Mullins, LLP

(57) ABSTRACT

A CIS test probe card with an optic assembly is disclosed. At least one embodiment relates to the optic assembly being located close to the CIS test probe card to collimate a light before it is projected through the CIS test probe card to the wafer. At least one embodiment relates to a change in the geometric configuration of the hole(s) and the probe(s) in the CIS test probe card. Small holes corresponding to the CIS chips in a one-on-one fashion can be implemented, such that each small hole is located over a corresponding CIS chip.

6 Claims, 7 Drawing Sheets

CMOS IMAGE SENSOR TEST PROBE CARD

CROSS-REFERENCE TO RELATED APPLICATIONS

This application claims the benefit of Prov. App. 61/117,568, filed Nov. 24, 2008, the entire contents of which are hereby incorporated by reference.

BACKGROUND OF THE INVENTION

1. Field of the Invention

The present invention generally relates to a probe card, and more particularly to a CIS circuit test probe card.

2. Description of the Prior Art

Testing of a CMOS Image Sensor (CIS) can be implemented using a CIS test probe card. While functional in some ways, the conventional CIS test probe card has deficiencies in others, especially when the size of CIS chip is reduced and/or the required testing environment is strict.

Diagrammatic structures of both a conventional CIS chip and a conventional application of a CIS test probe card are separately shown in FIG. 1A and FIG. 1B. As shown in FIG. 1A, each CIS chip 10 has a light sensing region 11 and at least one pad 12 located around the light sensing region 11. As shown in FIG. 1B, light 165 is emitted from a light source 16 (such as a lamp) and then passed through a tester 17 with a hole 175 before the light 165 is projected through a conventional CIS test probe card 18 and onto a wafer 19 having CIS chips 195. Here, the conventional CIS test probe card 18 has probes 185 capable of contacting the CIS chips 195, such that the signals are transmitted from the CIS chips 195 through the CIS test probe card 18 and to the tester 17 capable of analyzing the signals. Moreover, if necessary, a collimator can be located close to the light source 16 such that the light 165 is collimated.

A first deficiency in this context is the non-uniformity (divergency) of the light 165 projected onto the CIS chips 195. To provide better testing condition, it is better that all CIS chips 195 receive the same projected light 165, such that different signals (from different CIS chips 195) are induced by the differences among the CIS chips 195. However, as the emitted light 165 is not perfectly parallel light, its projection onto different portions of the wafer (onto different CIS chips 195) will have different incidental angles, which in turn will induce different signals on the different CIS chips 195, even those CIS chips 195 that are essentially similar. Of course, a simple solution is using a better light source 16, such as a highly qualify laser. However, the cost also will be significantly increased, and the laser may not be perfectly collimated either.

A second deficiency is the shadow effect induced by the probes 185. For conventional commercial products, the CIS test probe card 18 has a large hole 188 which covers all CIS chips 195 on the wafer 19, with the probes 185 being located near the large hole 188. Therefore, the probes 185 connected to the CIS chips 195 on the center portion of the wafer 19 usually will interact with the light 165 projected to the CIS chips 195 on the center portion of the wafer 19. As a result, shadows of the probes 185 are almost unavoidable. In addition, even if the shadows are reduced or avoided, the effect of light scattered by the probes 185 also can be unavoidable.

It is necessary to develop easy and low cost approaches to overcome the above deficiencies.

SUMMARY OF THE INVENTION

At least one embodiment of the invention relates to an optic assembly located close to the CIS test probe card to collimate a light before it is projected through the CIS test probe card to the wafer. Herein, the optic assembly can be a single collimator, or a combination of lenses (such as convex lens, concave lens and Fresnel lens). Clearly, because the light collimated by the optic assembly is directly propagated through the CIS test probe card to the wafer, the distance between the source of the collimated light and the wafer is effectively decreased whereby the divergency of light can be reduced. Therefore, the deficiency induced by the non-uniformity (divergency) of the light projected onto the wafer is effectively improved.

At least one embodiment of the present invention relates to a change in the geometric configuration of the hole(s) and the probe(s) in the CIS test probe card. There are small holes corresponding to the CIS chips in a one-on-one fashion, such that each small hole is located over a corresponding CIS chip. Here, for each CIS chip, the corresponding probes are located near the corresponding small hole, such that the probes for a specific CIS chip will not overlap with other CIS chips (or the light sensing regions of other CIS chips). Moreover, by properly adjusting the probes, it is possible that the probes for a specific CIS chip will not overlap with the light sensing region of the CIS chip. Therefore, the deficiency induced by shadows of probes on the light sensing region can effectively be improved.

DETAILED DESCRIPTION OF THE INVENTION

Reference will now be made in detail to specific embodiments of the invention. Examples of these embodiments are illustrated in the accompanying drawings. While the invention will be described in conjunction with these specific embodiments, it will be understood that the intent is not to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 2A:
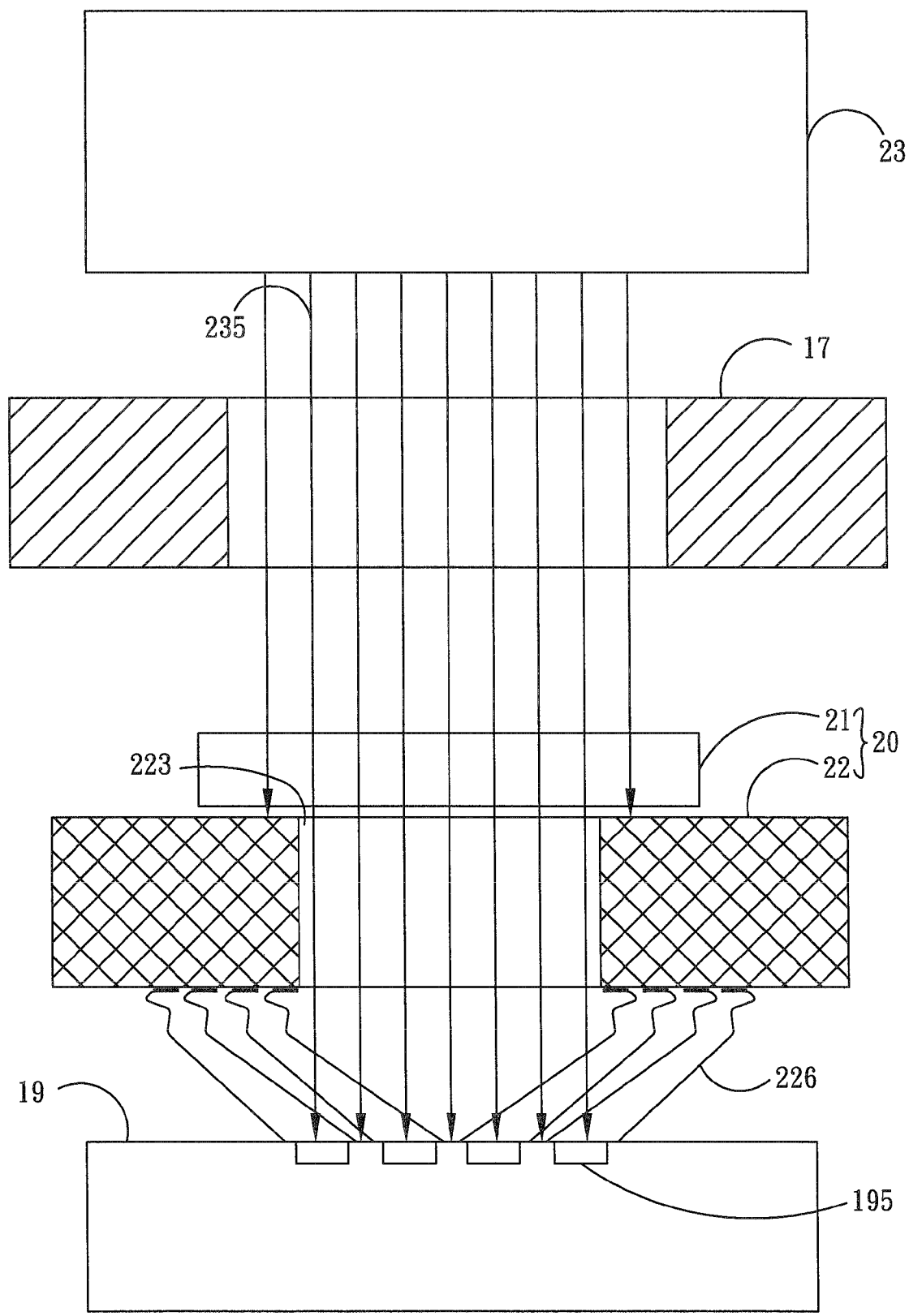
FIG. 2A is a diagrammatic representation of the structure of a CIS test probe card according to an embodiment of the present invention.

One embodiment according to the invention relates to an application of a CIS circuit test probe card. As shown in FIG. 2A, the CIS circuit test probe card 20 of this embodiment can have an optic assembly 21 and a board 22. The board 22 has at least one light passing region (e.g., hole) 223 and at least one probe 226, with according to the exemplary depiction each probe 226 being located near a corresponding hole 223. The structure of the board 22 can be equal to or equivalent to the structure of the board of a conventional CIS circuit test probe card. The optic assembly 21 is located close to the hole(s) 223 and is capable of collimating a light 235 from a light source 23 before the light 235 is projected onto the board 22.

Significantly, by positioning the optic assembly 21 close to board 22 arranged with the hole(s) 223 and probe(s) 226, diverse light 235 projected onto the board 22 is clearly improved as compared with conventional structures in that light is efficiently directed (e.g., mostly collimated) by an optic element or assembly (e.g., collimator) close to the light source. Clearly, when the light is highly collimated, the incidental angle over different CIS chips is reduced.

Details of the optic assembly 21 are not limited to those of the described and depicted embodiment. For example, the optic assembly 21 can be a collimator or a combination of at least two lenses. In short, the lens can be chosen from a group consisting of one or more of the following: convex lens, concave lens, convex-concave lens, concave-convex lens, convex-flat lens, concave-flat lens, Fresnel lens and combinations thereof. For example, to properly collimate the light, regardless of the details of the combination of lenses, the optic assembly 21 can as an option comprise a first convex surface facing the light source and a second convex surface facing the board.

Further, to ensure the result of collimated light and/or to avoid damages induced by scattered light, it can be better for the cross-sectional area of the light 235 (e.g., the cross-sectional area of the spot of light 235) projected on the board 22 to be larger than the cross-sectional area of the hole(s) 223. In other words, one or more, or all, of the holes 223 can be covered by the projected region of collimated light 235. Again, to ensure the result of collimated light 235, specifically to avoid the increased diversion thereof when a non-perfect light propagates through, for example, a long distance, it can be better to directly contact the optic assembly 21 with the board 22, such that the collimated light 235 is propagated by the optic assembly 21 and then into the hole 223.

Figure 1A:
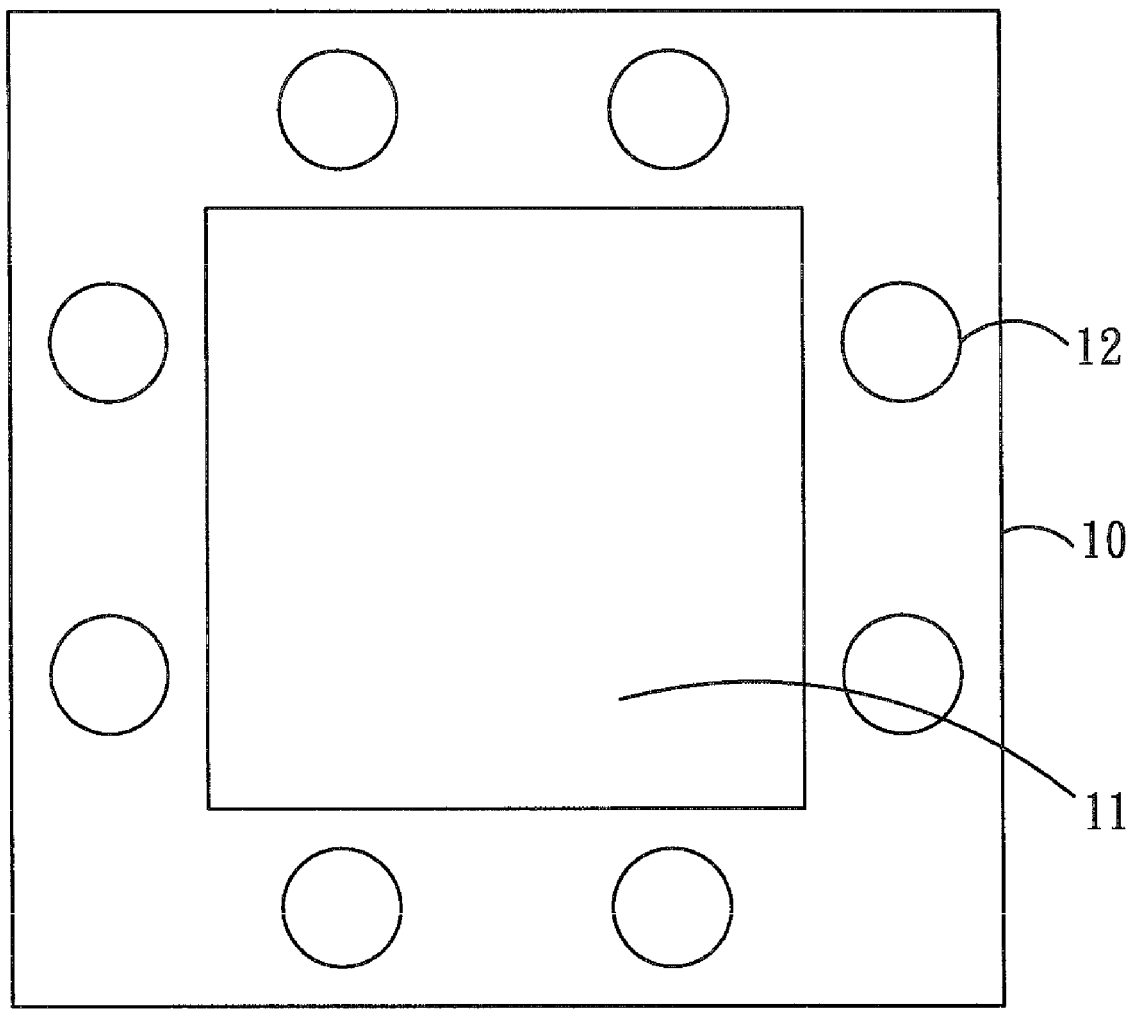
FIG. 1A is a diagrammatic representation of a conventional application of a CIS chip.
Figure 1B:
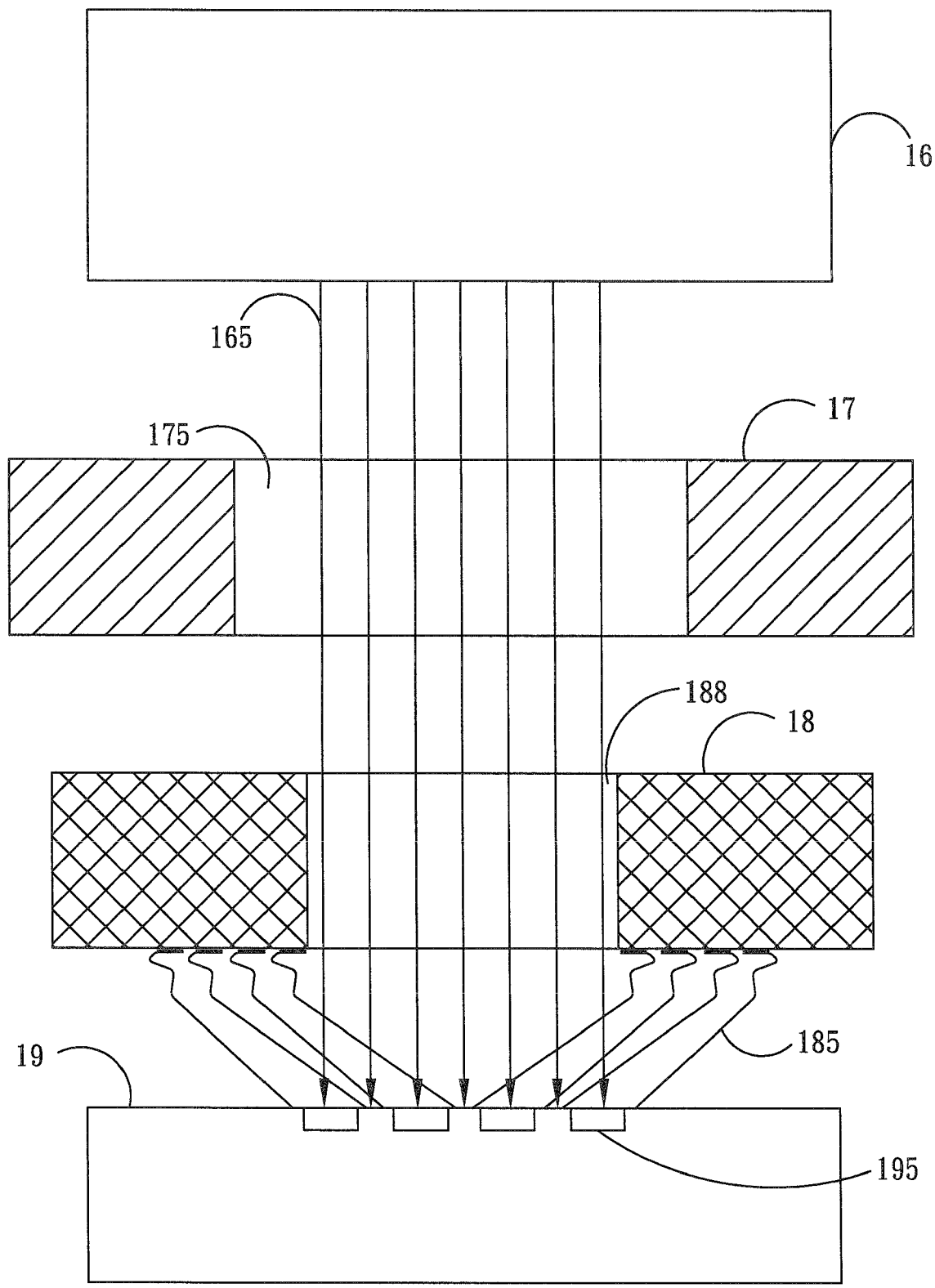
FIG. 1B is a diagrammatic representation of a conventional design of a CIS test probe card.
Figure 2B:
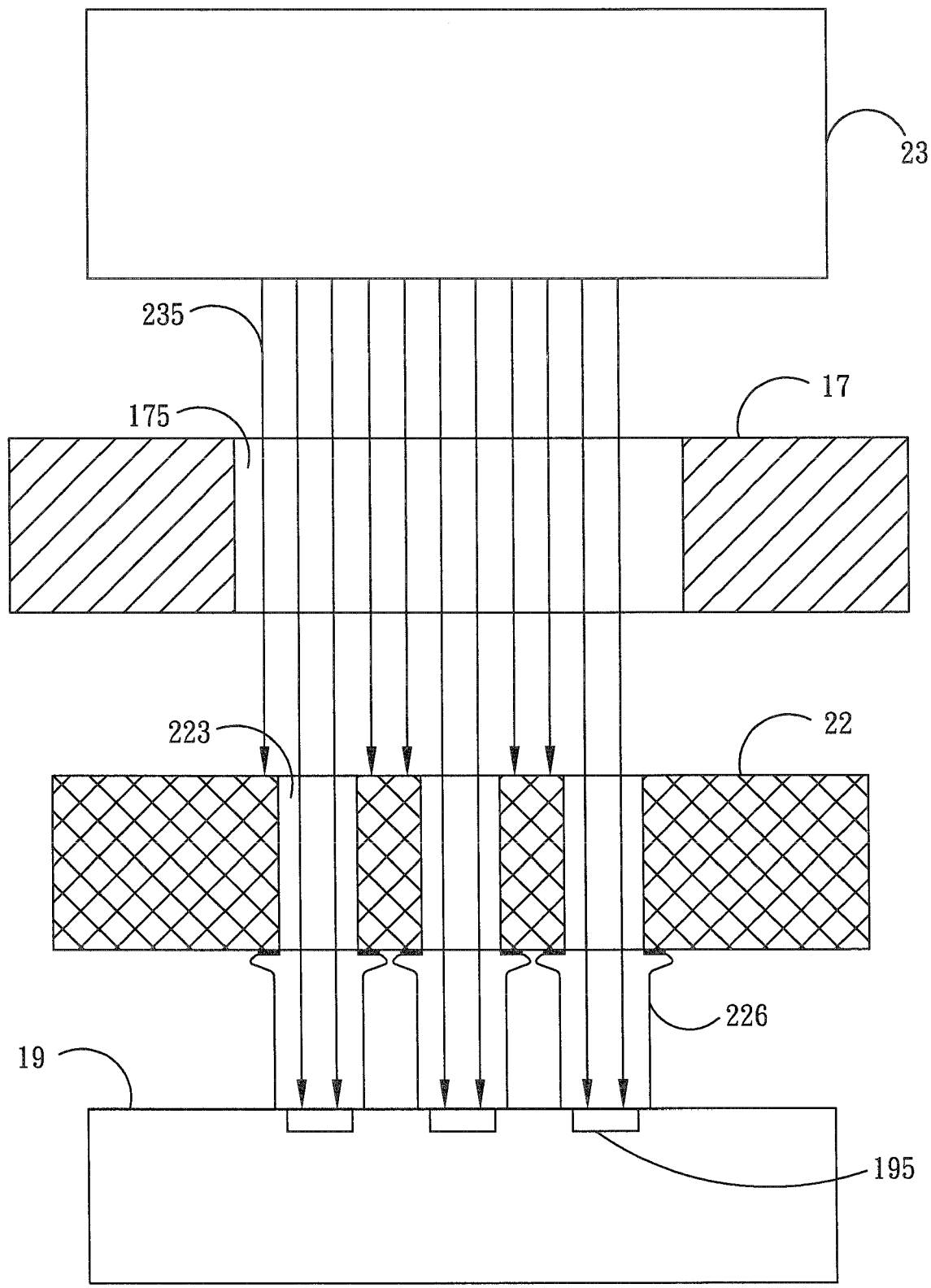
FIG. 2B is a diagrammatic representation of the structure of a CIS test probe card according to another embodiment of the present invention.

Another embodiment relating to an application of a CIS circuit test probe card of the invention is shown in FIG. 2B, in which the CIS circuit test probe card can comprise a board 22 with holes 223 and probes 226. As shown, each probe 226 is located near (e.g., aligned with and/or connected to) a corresponding hole 223. Clearly, a main difference between this embodiment and an arrangement of the prior art is that the conventional large hole (such as the large hole 188 shown in FIG. 1A) is replaced by small holes 223, such that the probe (s) 226 for each CIS chip 195 can be located near a corresponding hole(s) 223. Hence, each probe 226 can extend from the board 22 to the pad of a CIS chip 195 without overlapping other CIS chips 195. Thus, the risk of having shadows of probes 226 on one or more of the CIS chips 195 (at least the light sensing regions of the CIS chip(s) 195) is effectively reduced. Of course, for different wafers 19 to be tested, the geometric configuration of the board 22 (the layout of the holes 223 and the probes 226) should be designed accordingly. Clearly, when the locations/shapes of the CIS chips 195 are different, and/or when the distributions of the CIS chips 195 over the wafer are different, the locations/shapes of the holes/probes 223/226 should be different.

For ensuring that the light is properly or optimally projected, it can be better for each hole 223 to cover totally (e.g., completely) the corresponding CIS chip 195 (e.g., at least the light sensing region of the corresponding CIS chip 195). Also, for a (e.g., each) specific hole 223 corresponding to a specific CIS chip 195, it can be better for the corresponding (e.g., bridging, coupling, or connecting) probe 226 to be arranged to connect (e.g., capable of connecting) to the pad(s) of the specific CIS chip 195 located near (e.g., nearest, or directly under) the specific hole 223. In other words, when different probes 226 corresponding to different CIS chips 195 are located on different portions of the board 22, it can be better for each portion not to overlap with other portions. However, to the extent cost may be increased and manufacture may be complex, the concept of the embodiment is not required. For example, a possible scenario is a probe 226 being connected to a pad of a first CIS chip 195 while also being located near a second hole 223 that corresponds to a second CIS chip 195, whereby the shape and location of the probe 226 is properly adjusted such that it does not overlap with any CIS chip 195 other than the first CIS chip 195 (or the light sensing region of any CIS chip 195).

To achieve any of the embodiments, it is possible to form one or more (e.g., all) of the probes 226 using cobra technology (e.g., the probe(s) being a cobra pin), instead of (e.g., or in addition to) epoxy probe structures popularly used with conventional CIS circuit test probe cards.

Figure 2C:
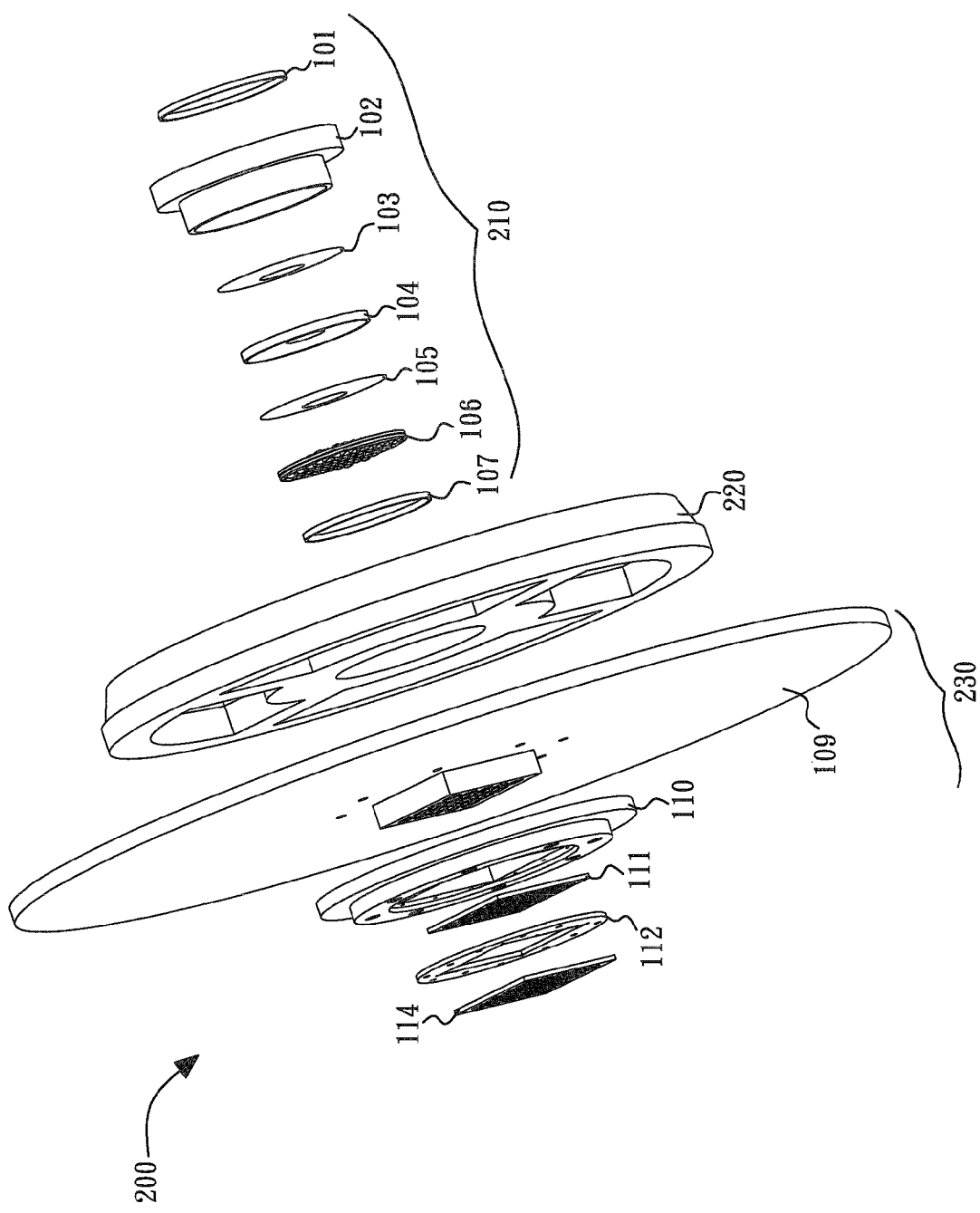
FIGS. 2C-2E show diagrammatic representations of the structure of a CIS test probe card according to an embodiment of the present invention.
Figure 2D:
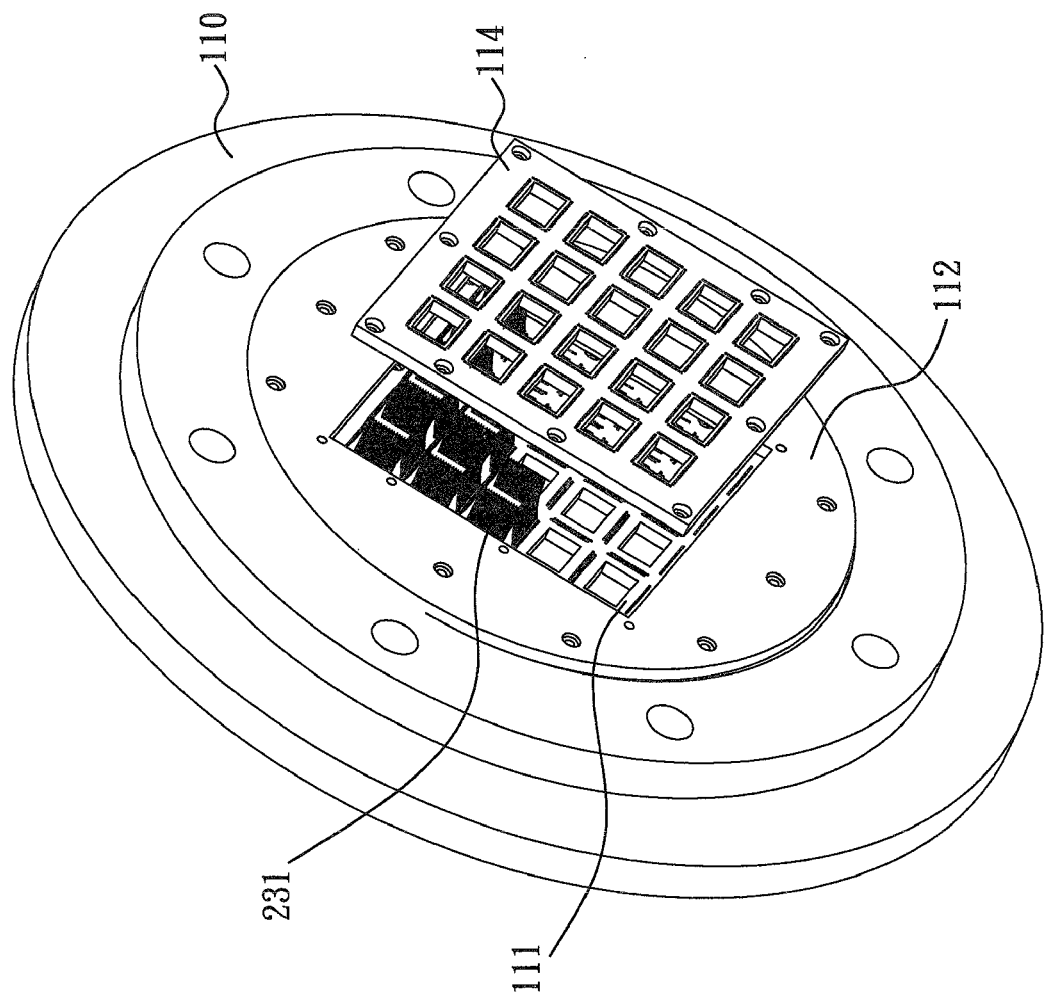
Figure 2E:
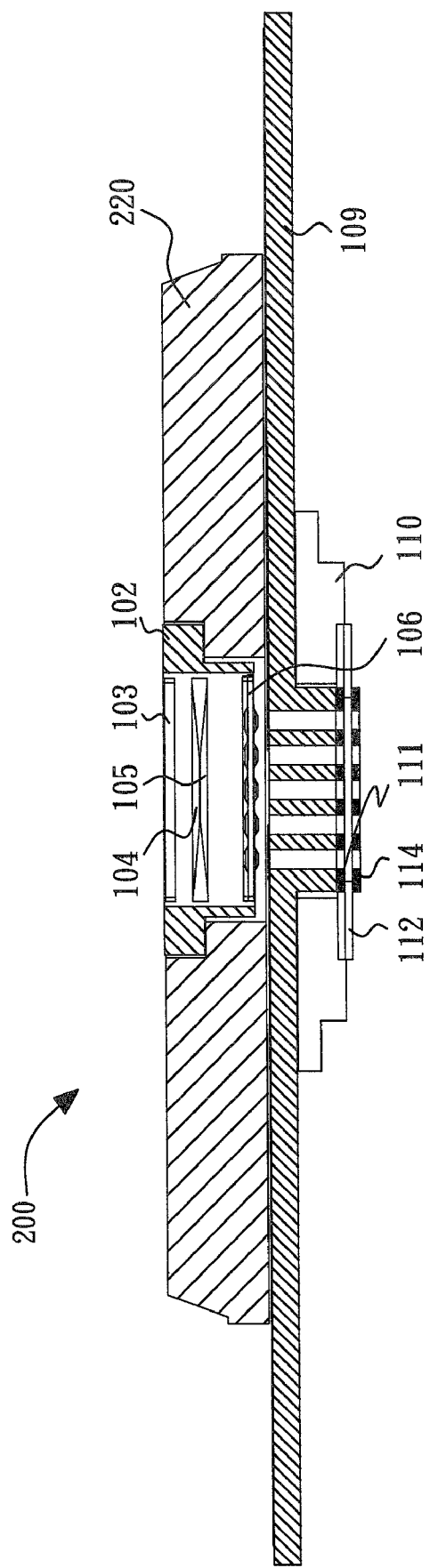

FIGS. 2C-2E show diagrammatic representations of the structure of a CIS test probe card according to an embodiment of the present invention. The CIS circuit test probe card 200 includes an optic assembly 210, a stiffener 220, and a board 230.

The optic assembly 210 includes a first lock ring 101, an optic sleeve 102, a convex lens 103, a concave lens 104, a convex lens 105, an ommateum 106, and a second lock ring 107. The convex lens 103, the concave lens 104, the convex lens 105, and the ommateum 106 are assembled within the optic sleeve 102 by the first lock ring 101 and the second lock ring 107.

The ommateum 106 has a plurality of convex areas. The geometric configuration of the convex areas is configured according to the geometric configuration of a wafer to be tested. The convex areas of the ommateum 106 are used for increasing the intensity of light projected to each CIS chip 195.

The optic assembly 21 is capable of collimating a light from a light source before the light is projected onto the board 230. The diversion of light projected onto the board 230 is clearly improved as compared with conventional structures in that light is mostly collimated by a collimator close to the light source. Clearly, when the light is highly collimated, the incidental angle (e.g., variances of the incidental angle) over (e.g., among) different CIS chips is reduced.

The stiffener 220 is disposed between the optic assembly 210 and the board 230. The stiffener 220 is used for improving the stiffness of the CIS circuit test probe card 200. Thus, the CIS circuit test probe card 200 can be used in a low-temperature environment, a room-temperature environment, or a high-temperature environment.

The board 230 includes a PCB board 109, a mounting ring 110, an upper guide plate 111, a spacer 112, a lower guide plate 114, and a plurality of probes 231. The spacer 112 is disposed between the upper guide plate 111 and the lower guide plate 114 for retaining a suitable distance between the upper guide plate 111 and the lower guide plate 114. The probes 231 are assembled on the upper guide plate 111 and the lower guide plate 114. The upper guide plate 111 and the lower guide plate 114 have small holes respectively. The geometric configuration of the small holes is configured according to the geometric configuration of a wafer to be tested. Each probe 231 is located near a corresponding one of the small holes. Each probe 231 can extend from the board 230 to the pad of a CIS chip 195 without overlapping other CIS chips 195. The risk of having shadows of probes on at least one CIS chip 195 is effectively reduced.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A CIS circuit test probe card, comprising:
a board, said board having a plurality of holes and a plurality of probes, each said probe being located near to a corresponding one of said holes, wherein the geometric configuration of said plurality of holes and said plurality of probes is configured according to the geometric configuration of a wafer to be tested, said wafer having a plurality of CIS chips where each has a light sensing region and at least one pad located around said light sensing region, wherein when testing said wafer, each said hole is located over a corresponding one of said CIS chips, and each said probe is not located over said light sensing region; and
an optic assembly, wherein said optic assembly is located over said plurality of holes, and wherein lights of a light source are projected to said plurality of CIS chips through said optic assembly and said plurality of holes, and said optic assembly comprises a first lock ring, an optic sleeve, a convex lens, a concave lens, a convex lens, an ommateum, and a second lock ring.

2. The CIS circuit test probe card as set forth in claim 1, wherein each said hole completely exposes an upper surface of a corresponding one of said CIS chips to said light source.

3. The CIS circuit test probe card as set forth in claim 1, wherein each said hole totally exposes said light sensing region of a corresponding one of said CIS chips to said light source.

4. The CIS circuit test probe card as set forth in claim 1, when each specific hole corresponds to a specific GIS chip and each of said probes is capable of connecting to at least one pad of said specific CIS chip located near said specific hole.

5. The CIS circuit test probe card as set forth in claim 4, wherein different ones of said probes corresponding to different ones of said CIS chips are located on different portions of said board, and said portions do not overlap.

6. The CIS circuit test probe card as set forth in claim 1, wherein each said probe is a cobra pin.

* * * * *